(12) United States Patent
Brooks et al.

(10) Patent No.: US 7,549,373 B2
(45) Date of Patent: Jun. 23, 2009

(54) INTEGRATED ACTIVATING DEVICE FOR EXPLOSIVES

(75) Inventors: James E Brooks, Manvel, TX (US);
Nolan C. Lerche, Stafford, TX (US);
Frank A. Duva, Carlsbad, CA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1237 days.

(21) Appl. No.: 10/304,205

(22) Filed: Nov. 26, 2002

(65) Prior Publication Data

US 2004/0003743 A1 Jan. 8, 2004

Related U.S. Application Data

(60) Provisional application No. 60/333,586, filed on Nov. 27, 2001.

(51) Int. Cl.
*F42B 3/10* (2006.01)
(52) U.S. Cl. .................. 102/202.7; 102/202.5; 102/218; 361/779; 361/793
(58) Field of Classification Search .............. 102/202.5, 102/202.7, 217, 218; 361/779, 793
See application file for complete search history.

(56) References Cited

U.S. PATENT DOCUMENTS

| | | | | |
|---|---|---|---|---|
| 3,913,224 | A | * | 10/1975 | Preissinger et al. ........... 29/832 |
| 4,421,030 | A | * | 12/1983 | DeKoker ..................... 102/218 |
| 4,538,088 | A | * | 8/1985 | Malone ....................... 313/325 |
| 5,179,248 | A | * | 1/1993 | Hartman et al. .......... 102/202.4 |
| 5,309,841 | A | * | 5/1994 | Hartman et al. .......... 102/202.4 |
| 5,444,598 | A | | 8/1995 | Aresco |
| 5,731,538 | A | * | 3/1998 | O'Brien et al. .......... 102/202.5 |
| 6,199,484 | B1 | * | 3/2001 | Martinez-Tovar et al. 102/202.4 |
| 6,272,965 | B1 | * | 8/2001 | Baginski et al. ................ 86/1.1 |
| 6,302,024 | B1 | * | 10/2001 | Swart et al. .............. 102/202.5 |
| 6,318,267 | B1 | * | 11/2001 | Swart et al. .............. 102/202.5 |
| 6,356,455 | B1 | * | 3/2002 | Carpenter .................... 361/793 |
| 6,385,031 | B1 | | 5/2002 | Lerche et al. ................ 361/248 |
| 6,386,108 | B1 | | 5/2002 | Brooks et al. ................ 112/217 |
| 6,903,938 | B2 | * | 6/2005 | Waffenschmidt ............ 361/779 |
| 6,911,373 | B2 | * | 6/2005 | Kellar et al. ................. 438/399 |

FOREIGN PATENT DOCUMENTS

| | | |
|---|---|---|
| EP | 0555651 A1 | 8/1993 |
| WO | WO 00/20820 A2 | 4/2000 |
| WO | WO 01/46638 A1 | 6/2001 |

\* cited by examiner

*Primary Examiner*—Michelle Clement
(74) *Attorney, Agent, or Firm*—Kevin B. McGoff; James L. Kurka; Trop, Pruner & Hu, P.C.

(57) ABSTRACT

A detonator assembly according to one arrangement includes a capacitor discharge unit having a capacitor and a resistor formed on a surface of the capacitor. At least one side of the resistor is electrically connected to one electrode of the capacitor. In another arrangement, another type of energy source besides the capacitor is used.

23 Claims, 4 Drawing Sheets

INTEGRATED ACTIVATING DEVICE FOR EXPLOSIVES

CROSS REFERENCE TO RELATED APPLICATIONS

This claims the benefit under 35 U.S.C. § 119(e) of U.S. Provisional Application Ser. No. 60/333,586, entitled "Integral Capacitor Discharge Unit," filed Nov. 27, 2001.

TECHNICAL FIELD

The invention relates generally to integrated activating devices for explosives.

BACKGROUND

Explosives are used in many types of applications, such as hydrocarbon well applications, seismic applications, military armament, and mining applications. In seismic applications, explosives are discharged at the earth surface to create shock waves into the earth subsurface so that data regarding the characteristics of the subsurface can be measured by various sensors. In the hydrocarbon well context, a common type of explosive that is used includes shaped charges in perforating guns. The shaped charges, when detonated, create perforating jets to extend perforations through any surrounding casing or liner and into the surrounding formation to allow communication of fluids between the formation and the wellbore. Also, in a well, other tools may also contain explosives. For example, explosives can be used to set packers or to activate other tools.

To detonate explosives, detonators are used. Generally, detonators can be of two types: electrical and percussion. A percussion detonator responds to some type of mechanical force to activate an explosive. An electrical detonator responds to a predefined electrical signal to activate an explosive. One type of electrical detonator is referred to as an electro-explosive device (EED), which may include hot-wire detonators, semiconductor bridge (SCB) detonators, exploding bridge wire (EBW) detonators, or exploding foil initiator (EFI) detonators.

With certain types of electrical detonators, a local electrical source is placed in the proximity of the detonator. Such an electrical source may be in the form of a capacitor discharge unit that includes a capacitor that is charged to a predetermined voltage. In response to an activation signal, the charge stored in the capacitor is discharged into another device to perform a detonation operation. Typically, due to the relatively large amount of energy that is needed, the capacitor discharge unit can be quite large, which leads to increased sizes of housings in downhole tools that contain such capacitor discharge units. Further, because of relatively large sizes, the efficiencies of conventional capacitor discharge units are reduced due to increased resistance and inductance of electrical paths in a detonator.

SUMMARY

In general, an improved detonator is provided that is smaller in size and that is more efficient. For example, in one embodiment, a detonator assembly includes an energy source (e.g., a capacitor) having a surface, the energy source further having electrodes. A resistor is formed on the surface of the energy source, with one end of the resistor being electrically connected to one of the electrodes.

In some example arrangements, resistors are formed on the surface of the capacitor with thick-film deposition. For example, one type of resistor is a charging resistor. Another type of resistor is a bleed resistor that connects the two electrodes. The surface of the capacitor is used to attach electrically a switch and/or an initiator, such as an exploding foil initiator (EFI).

Other features and embodiments will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments are possible.

As used here, the terms "up" and "down"; "upper" and "lower"; "upwardly" and downwardly"; "upstream" and "downstream"; "above" and "below"; and other like terms indicating relative positions above or below a given point or element are used in this description to more clearly describe some embodiments of the invention. However, when applied to equipment and methods for use in environments that are deviated or horizontal, such terms may refer to a left to right, right to left, or other relationship as appropriate.

Figure 1A:
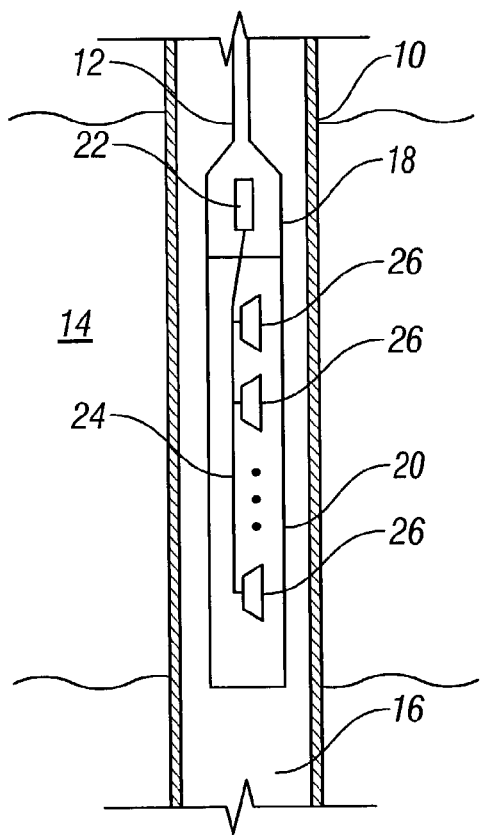
FIGS. 1A and 1B illustrate two tool strings according to some embodiments of the invention.

Referring to FIG. 1A, an embodiment of a tool string includes a perforating string having a perforating gun 20 and a firing head 18. The perforating string is attached at the end of a carrier line 12, such as a wireline, electrical cable, slickline, tubing, and so forth. In the embodiment of FIG. 1A, the firing head 18 includes an exploding foil initiator (EFI) detonator assembly 22 according to one embodiment. As discussed below, the EFI detonator assembly 22 includes an integrated assembly of a capacitor discharge unit (CDU) and EFI.

More generally, the integrated capacitor discharge unit has a capacitor and a charging and bleed resistor. The integrated capacitor discharge unit includes a thick-film circuit that electrically connects the capacitor and the resistor, as well as other components.

The detonator assembly 22 is coupled to a detonating cord 24, which is connected to a number shaped charges 26. Activation of the detonator assembly 22 causes initiation of the detonating cord 24, which in turn causes detonation of the shaped charges 26. Detonation of the shaped charges 26 causes the formation of perforating jets from the shaped charges 26 to extend openings into the surrounding casing 10 and to extend perforation tunnels into the surrounding formation 14.

Figure 1B:
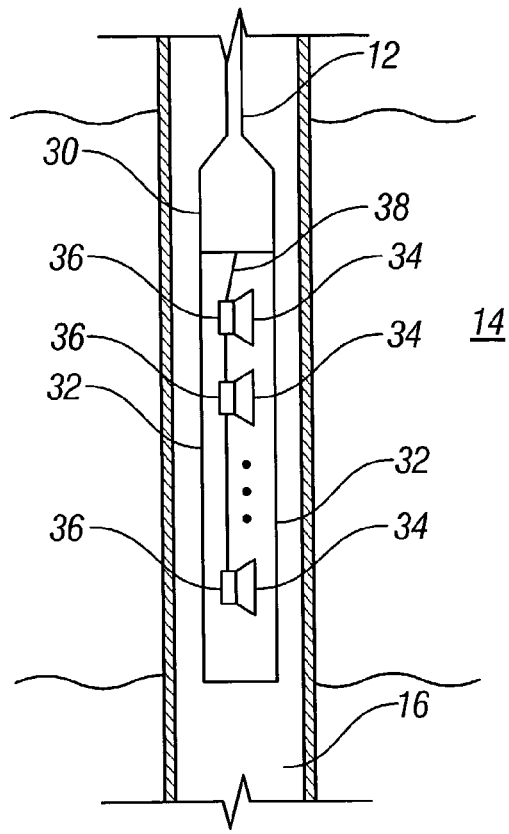

FIG. 1B shows another embodiment of the perforating string, which includes a firing head 30 and a perforating gun 32. The perforating gun 32 also includes multiple shaped charges 34. However, instead of the shaped charges 34 being connected to a detonating cord, each shaped charge 34 is associated with a respective local detonator assembly 36. In one embodiment, each of the detonator assemblies 36 include EFI detonator assemblies that are configured similarly to the detonator assembly 22 of FIG. 1A. The detonator assemblies 36 are connected by an electrical cable 38, which provides an electrical signal to the detonator assemblies 36 to activate such detonator assemblies. The firing head 30 receives a remote command from elsewhere in the wellbore 16 or from the surface of the wellbore.

A benefit offered by the perforating string of FIG. 1B is that the shaped charges 34 can be substantially simultaneously detonated in response to an activating signal or voltage supplied down the electrical cable 38. This is contrasted to the arrangement of FIG. 1A, where detonation of successive shaped charges 26 is delayed by the speed of a detonation wave traveling down the detonating cord 24.

Although the arrangement of FIG. 1B includes multiple detonating assemblies 36, as compared to the single detonator assembly 22 in the arrangement of FIG. 1A, the small size of the detonating assemblies 36 according to some embodiments allows such detonating assemblies to be included in the perforating gun 32 without substantially increasing the size of the perforating gun 32.

As noted above, in one embodiment, an electrical signal is provided to the firing head 22 or 30 to activate the perforating gun 20 or 32. However, in alternative embodiments, the activating signal can be in the form of pressure pulse signals, hydraulic pressure, motion signals transmitted down the carrier line 12, and so forth.

Instead of perforating strings, detonator assemblies according to some embodiments can be used in other types of tool strings. Examples of other tool strings that contain explosives include the following: pipe cutters, setting devices, and so forth. Also, detonator assemblies according to some embodiments can also be used for other applications, such as seismic applications, mining applications, or military armament applications. In seismic applications, the detonator assemblies are ballistically connected to explosives used to generate sound waves into the earth sub-surface for determining various characteristics of the earths sub-surface.

As noted above, in one embodiment, the detonator assembly 22 includes an EFI detonator assembly. EFIs include an exploding foil "flyer plate" initiator or an exploding foil "bubble activated" initiator. Other types of detonator assemblies can use other types of electrical initiators, such as exploding bridge wire (EBW) initiators and semiconductor bridge (SCB) initiators.

Figure 2:
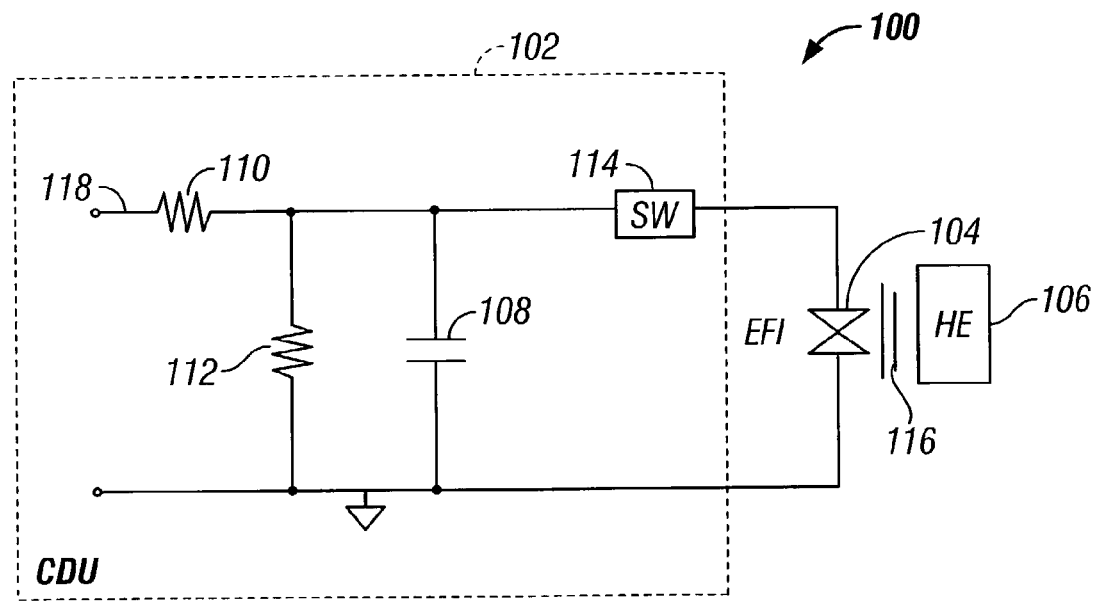
FIG. 2 is a schematic electrical diagram of a detonator assembly that can be used in the tool string according to FIGS. 1A or 1B.

As shown in FIG. 2, an electrical schematic diagram of one embodiment of a detonator assembly 100. The detonator assembly 100 can be either the detonator assembly 22 of FIG. 1A or the detonator assembly 36 of FIG. 1B. The detonator assembly 100 includes a capacitor discharge unit (CDU) 102, an EFI 104, and a high explosive (HE) 106.

The CDU 102 includes a capacitor 108, a charging resistor 110, and a bleed resistor 112. In addition, the CDU 102 includes a switch 114 for coupling charge stored in the capacitor 108 to the EFI 104 to activate the EFI 104. When activated, the EFI 104 produces a flyer that traverses a gap 116 to impact the high explosive 106. The impact of the flyer against the high explosive 106 causes detonation of the explosive 106. The explosive 106 is ballistically coupled to either the detonating cord 24 (FIG. 1A) or to an explosive of a shaped charge 34 (FIG. 1B). In some embodiments, the internal resistance of the capacitor may be sufficient and a separate charging resistance not necessary.

The capacitor 108 is charged by applying a voltage at line 118. The voltage is supplied through the charging resistor 110 into the capacitor 108. The charging resistor 110 is provided for limiting current (in case of a short in the capacitor 108 or elsewhere in the CDU 102). The charging resistor 110 also provides isolation of the CDU 102 from other CDUs in the tool string.

The bleed resistor 112 allows the charge in the capacitor 108 to bleed away slowly. This is in case the detonator assembly 100 is not fired after the tool string has been lowered into the wellbore. The bleed resistor 112 prevents the CDU 102 from becoming a safety hazard when a tool string with unfired detonator assemblies 100 have to be retrieved back to well surface.

In other embodiments, other detonator assemblies with other types of energy sources (other than the capacitor 108) can be employed.

The detonator assembly 100 includes an integrated assembly of the CDU 102 and EFI 104 to provide a smaller detonator assembly package as well as to improve efficiency in performance of the detonator assembly 100. Efficient CDUs need to have fast discharge times (such as nanosecond reaction rates through a low inductance path) through the EFI with low energy loss (low resistance). One way to increase the efficiency is to reduce as much as possible the inductance (L) and resistance (R) of the total circuit in the discharge loop of the CDU 102. By integrating the CDU 102 into a smaller package, the inductance and resistance can be reduced, thereby improving the efficiency of the CDU 102.

According to some embodiment of the invention, the charging resistor 110 and bleed resistor 112 are implemented as resistors formed on a surface of the capacitor 108. Further, in some embodiments, the switch 114 is also integrated onto the surface of the capacitor 108, which further reduces the overall size of the CDU 102.

Figure 3:
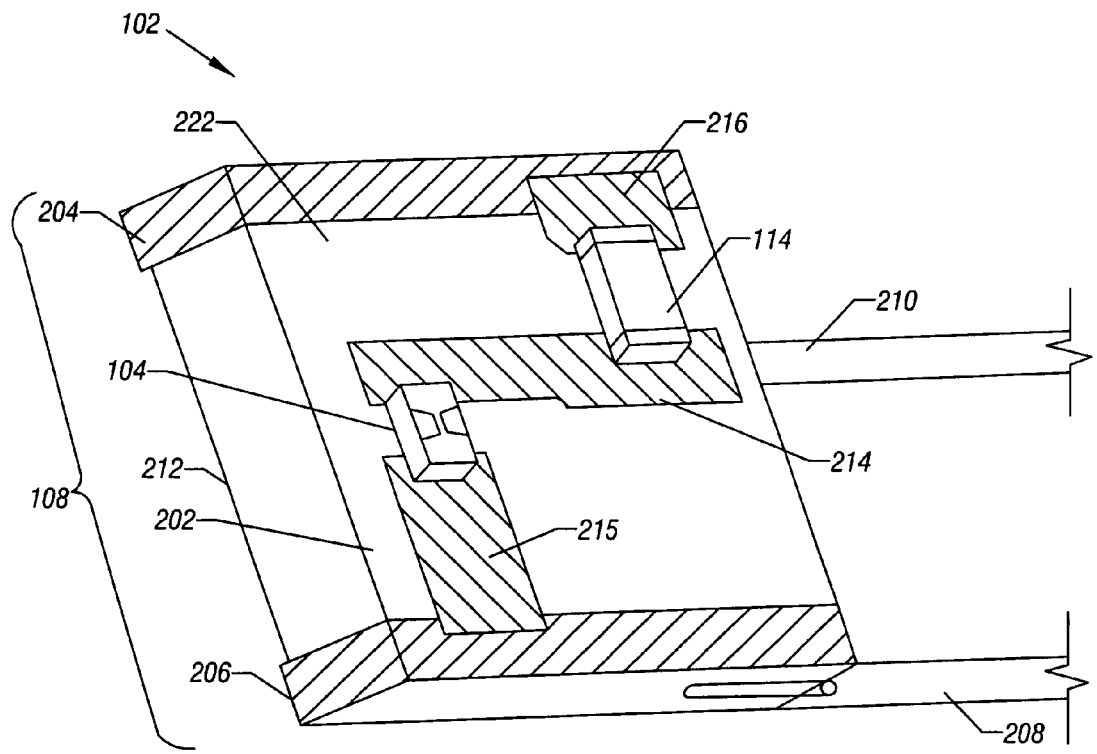
FIG. 3 is a perspective view of the detonator assembly.

FIG. 3 shows the CDU 102 according to one embodiment. The capacitor 108 in one embodiment includes a ceramic capacitor, which has an outer ceramic housing 202 formed of a ceramic material. However, in other embodiments, other types of capacitors can be used. The capacitor 108 includes a first group of one or more electrically conductive layers that are connected to one electrode, referred to as a cathode. A second group of one or more electrically conductive layers in the capacitor 108 are connected to another electrode of the capacitor, referred to as an anode. One or more layers of dielectric material are provided between the cathode and anode electrically conductive layers. The cathode layers, anode layers, and dielectric layers are provided inside the outer housing 202 of the capacitor 108. As shown in FIG. 3, the capacitor 108 has a first electrode 204 and second electrode 206. The electrodes 204 and 206 form the cathode and anode of the capacitor 108.

The capacitor electrode 206 is electrically contacted to an electrical wire 208. Another electrical wire 210 is connected to a node of the charging resistor (not shown in FIG. 3), which is formed on the lower surface 212 of the capacitor 108.

Further, the EFI 104 is attached on an upper surface 222 of the capacitor 108. One side of the EFI 104 is connected by an electrically conductive plate 215 to the electrode 206 of the capacitor 108. The other side of the EFI 104 is electrically connected to an electrically conductive plate 214, which is in turn connected to one side of the switch 114. The other side of the switch 114 is electrically connected by another electrically conductive plate 216 to the capacitor electrode 204.

Electrical connections are provided by thick-film deposition. Any number of type of small switches can be used, such as those disclosed in U.S. Pat. No. 6,385,031 and U.S. Ser. No. 09/946,249, filed Sep. 5, 2001, both hereby incorporated by reference. Also that the EFI may include an integral switch as part of its construction.

Figure 4:
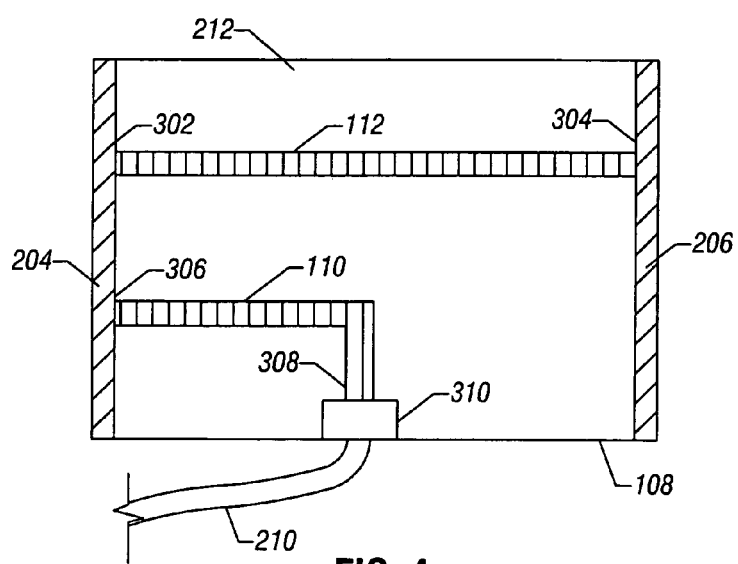
FIGS. 4-4A are bottom views of the detonator assembly.

A bottom view of the CDU 102 is shown in FIG. 4. The bleed resistor 112 and charging resistor 110 are both arranged as thick-film or thin-film resistors on the lower surface 212 of the capacitor 108. As depicted in FIG. 4, each of resistors 110 and 112 is formed in its entirety on the surface 212 of the capacitor 108. One end 302 of the bleed resistor 112 is electrically connected to the electrode 204, while the other end 304 of the resistor 112 is electrically connected to the electrode 206. One end 306 of the charging resistor 110 is electrically connected to the electrode 204, while the other end 308 of the resistor 110 is electrically connected to a contact pad 310. The contact pad 310 allows electrical connection of charging the resistor 110 with the electrical wire 210.

The material and geometry (thickness, width) of each resistor 110 and 112 are selected to achieve a target sheet resistance so that desired resistance values of resistors 110 and 112 can be achieved. In other embodiments, instead of thick-film or thin-film resistors, other types of resistors that can be deposited or otherwise formed on the capacitor housing can be used.

Figure 4A:
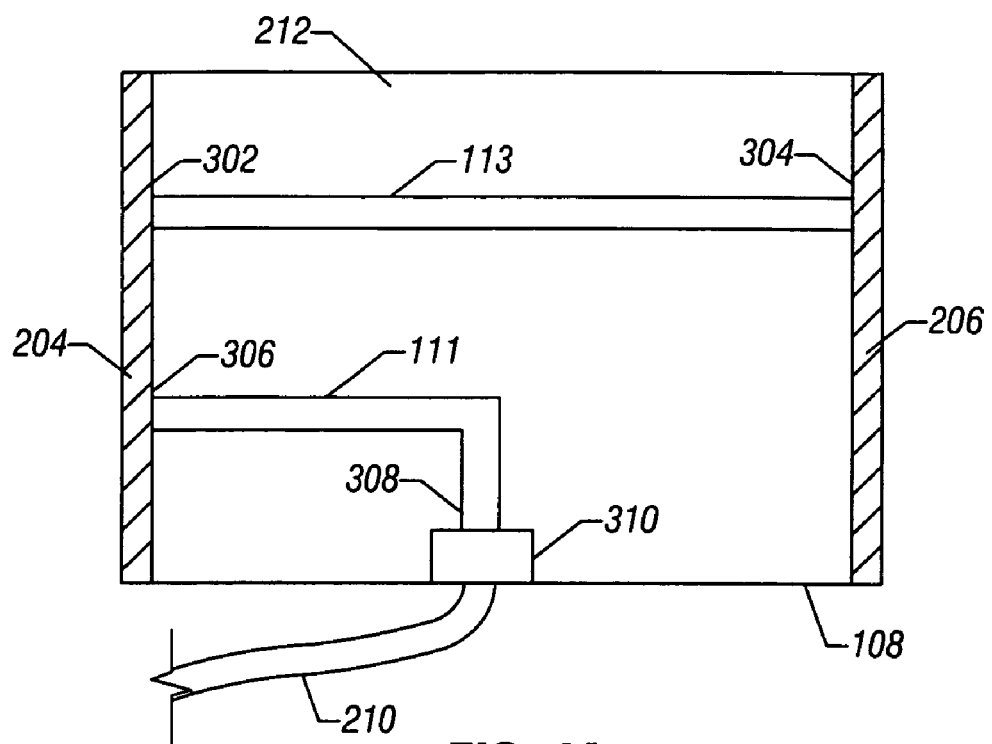

To form the resistors on a surface (or surfaces) of the capacitor housing, a groove or notch 111, 113 (FIG. 4A) can be formed in the outer surface(s) of the capacitor housing, followed by the deposition or introduction of resistance material into the groove or notch 111, 113 (FIG. 4A).

Figure 5:
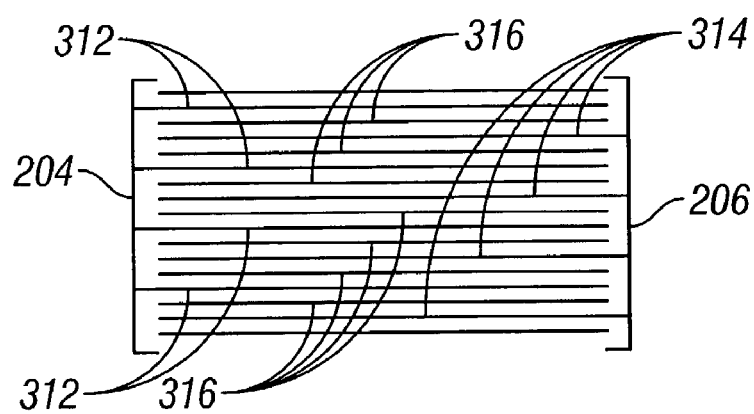
FIG. 5 is a schematic side view of a capacitor in the detonator assembly.

FIG. 5 shows a schematic representation of the layers of the capacitor 108. Electrically conductive layers 312 are connected to the first electrode 204, while electrically conductive layers 314 are connected to the electrode 206. In some embodiments, the electrically conductive layers 312 and 314 are formed of a metal, such as copper or other electrically conductive metal. Dielectric layers are provided between successive layers 312 and 314.

Figure 6:
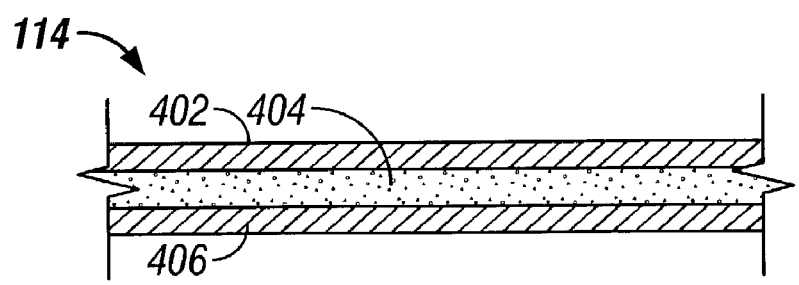
FIGS. 6 and 7 illustrate two different types of switches used in the detonator assembly of FIG. 2.

According to one embodiment, the switch 114 (FIG. 2) is implemented as an over-voltage switch. As shown in FIG. 6, one embodiment of the over-voltage switch 114 includes a first electrically conductive layer 402 and a second electrically conductive layer 406. Interposed between the electrically conductive layers 402 and 406 is an insulating (dielectric) layer 404. In one example implementation, the electrically conductive layers 402 and 406 are formed of copper or other electrically conductive metal. In one example implementation, the insulating layer 404 is formed of a polyimide material.

The insulating layer 404 has a thickness and a doping concentration controlled to cause the switch 114 to activate at a selected voltage difference between electrically conductive layers 402 and 406. Once the voltage crosses over some predefined threshold level, the insulating layer 404 breaks down to electrically connect the first and second electrically conductive layers 402 and 406 (thereby closing the switch 114).

Optionally, the breakdown voltage of the insulating layer 404 can be controlled by having the geometry of overlapping electrically conductive layers 402 and 406 be somewhat pointed to increase the potential gradient at the points. Further, depositing a hard metal such as tungsten on contact areas of the first and second electrically conductive layers 402 and 406 can prevent burn-back of the electrically conductive layers. The contact areas are provided to electrically connect the electrically conductive layers 402 and 406 to respective wires. The hardened metal also provides for a more efficient switch. Also, for increased efficiency, the gap distance between points is made small, such as on the order of a few thousands of an inch.

Figure 7:
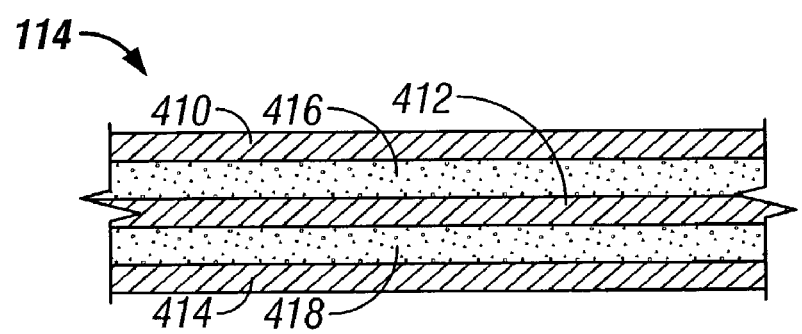

FIG. 7 illustrates another type of switch 114. This alternative switch is a triggered switch that adds another electrically conductive layer that is connected to a trigger voltage. As shown in FIG. 7, the triggered switch 114 includes top and bottom electrically conductive layers 410 and 414, in addition to an intermediate electrically conductive layer 412. Insulating layers 416 and 418 are provided between successively electrically conductive layers. In operation, a high voltage (reference to ground) with a fast rise time is applied to the trigger anode 412. The trigger voltage has sufficient amplitude to cause the insulating layers 416 and 418 to break down to allow conduction between the top and bottom electrically conductive layers 410 and 414.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A detonator assembly comprising:
 an energy source having a surface, the energy source further having electrodes;
 a resistor formed on the surface of the energy source, one end of the resistor being electrically connected to one of the electrodes; and
 an initiator formed on one of the surfaces of the energy source.

2. The detonator assembly of claim 1, wherein the energy source comprises a capacitor.

3. The detonator assembly of claim 2, further comprising an integrated capacitor discharge unit having the capacitor and the resistor.

4. The detonator assembly of claim 3, further comprising a switch electrically connected to the capacitor discharge unit.

5. The detonator assembly of claim 3, wherein the initiator is electrically connected to the capacitor discharge unit.

6. The detonator assembly of claim 1, wherein the initiator comprises one of a semiconductor bridge (SCB) detonator, exploding bridge wire (EBW) detonator, and exploding foil initiator (EFI) detonator.

7. The detonator assembly of claim 2, wherein the capacitor comprises a housing, the housing defining the surfaces.

8. The detonator assembly of claim 2, wherein the resistor is further electrically connected to another one of the electrodes.

9. The detonator assembly of claim 2, wherein the resistor comprises a bleed resistor adapted to bleed charge from the capacitor.

10. The detonator assembly of claim 9, wherein the capacitor has a housing defining the surfaces, the detonator assembly further comprising a second resistor formed on one of the surfaces of the capacitor housing, one end of the second resistor being electrically connected to one of the electrodes.

11. The detonator assembly of claim 10, wherein the second resistor has a second end to receive a charging voltage for the capacitor.

12. The detonator assembly of claim 11, further comprising a charging pad electrically connected to the second end of the second resistor.

13. The detonator assembly of claim 2, wherein the capacitor has a housing defining the surfaces, the detonator assembly further comprising a switch on one of the surfaces of the capacitor housing, one side of the switch being electrically connected to one of the electrodes of the capacitor.

14. The detonator assembly of claim 13, wherein the switch comprises an over-voltage switch responsive to application of a predetermined voltage.

15. The detonator assembly of claim 14, wherein the over-voltage switch comprises plural electrically conductive layers and at least one insulator layer between the electrically conductive layers.

16. The detonator assembly of claim 13, wherein the switch comprises a triggered switch.

17. The detonator assembly of claim 16, wherein the switch comprises at least three electrically conductive layers and at least two insulator layers, each insulator layer being between two successive electrically conductive layers.

18. The detonator assembly of claim 16, wherein the switch has a second side connected to the initiator, the switch when activated to electrically couple charge from the capacitor to the initiator.

19. The detonator assembly of claim 18, wherein the initiator comprises an exploding foil initiator.

20. The detonator assembly of claim 1, wherein the initiator is placed on a first one of the surfaces of the energy source, and the resistor is placed on a second one of the surfaces of the energy source.

21. The detonator assembly of claim 1, further comprising an explosive proximate the initiator.

22. The detonator assembly of claim 1, wherein the energy source comprises a ceramic capacitor.

23. The detonator assembly of claim 1, wherein the energy source has a housing defining the surfaces, wherein a groove is formed in a first one of the surfaces, and wherein the resistor is formed in the groove.

* * * * *